United States Patent
Imai (10) Patent No.: US 7,321,326 B2
(45) Date of Patent: Jan. 22, 2008

(54) CURRENT SOURCE CELL AND D/A CONVERTER USING THE SAME

(75) Inventor: Shigeo Imai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 158 days.

(21) Appl. No.: 11/302,000

(22) Filed: Dec. 12, 2005

(65) Prior Publication Data

US 2006/0192705 A1 Aug. 31, 2006

(30) Foreign Application Priority Data

Dec. 13, 2004 (JP) .............................. 2004-359704

(51) Int. Cl.
*H03M 1/66* (2006.01)

(52) U.S. Cl. ........................ 341/144; 341/135; 341/136

(58) Field of Classification Search ......... 341/135–136
See application file for complete search history.

(56) References Cited

U.S. PATENT DOCUMENTS

| | | | | |
|---|---|---|---|---|
| 4,725,813 | A * | 2/1988 | Miyada | 327/374 |
| 5,235,218 | A * | 8/1993 | Matsuo et al. | 327/538 |
| 5,703,582 | A * | 12/1997 | Koyama et al. | 341/120 |
| 5,706,006 | A * | 1/1998 | Hattori | 341/144 |
| 6,472,930 | B1 | 10/2002 | Morimoto et al. | |
| 6,509,854 | B1 * | 1/2003 | Morita et al. | 341/144 |
| 6,657,486 | B2 * | 12/2003 | Kimura | 327/563 |
| 6,683,549 | B2 * | 1/2004 | Kinugasa | 341/136 |
| 7,019,676 | B2 * | 3/2006 | Ikoma et al. | 341/144 |

FOREIGN PATENT DOCUMENTS

JP 2573427 10/1996

* cited by examiner

*Primary Examiner*—Khai M. Nguyen
(74) *Attorney, Agent, or Firm*—DLA Piper US LLP (57) ABSTRACT

A current source cell of one embodiment according to the present invention comprises: first and second transistors which are complementarily switched by a control signal; a constant current source which is commonly connected to one ends of current paths of the first and second transistors; third and fourth transistors which are respectively connected between the other ends of the current paths of the first and second transistors and first and second output terminals, and which being in normally conducting states; and an inversion amplifier having an input terminal which is commonly connected to the one ends of the current paths of the first and second transistors, and having output terminal which is commonly connected to control terminals of the third and fourth transistors. A D/A converter of one embodiment according to the present invention comprises: a decoder for decoding a digital input signal to output a control signal; a plurality of current source cells for outputting predetermined current in response to the control signal; and a resistor for converting a sum of output current of the plurality of current source cells into voltage; each of the current source cells being current source cell of one embodiment according to the present invention.

11 Claims, 9 Drawing Sheets

20, 20 ······ P-TYPE MOS TRANSISTOR
21 ······ DIFFERENTIAL AMPLIFIER
23 ······ CURRENT MIRROR CIRCUIT
Rref ······ RESISTOR
Vref ······ REFERENCE VOLTAGE

FIG. 1

20, 20 ······ P-TYPE MOS TRANSISTOR
21 ······ DIFFERENTIAL AMPLIFIER
23 ······ CURRENT MIRROR CIRCUIT
Rref ······ RESISTOR
Vref ······ REFERENCE VOLTAGE

FIG. 2

30 ······ FIRST OUTPUT TERMINAL
31 ······ SECOND OUTPUT TERMINAL
32 ······ INVERTER
M1, M2, M3, M4 ······ P-TYPE MOS TRANSISTOR
Vref2 ······ REFERENCE VOLTAGE

FIG. 3

Rout1 = vout1 / iout1
= A33·gm3·rds3·rds22

Rout2 = vout2 / iout2
= gm3·rds3·rds22

Va, Vb ······ REFERENCE VOLTAGE

50 ······ CURRENT SOURCE CELL
51 ······ SECOND CONSTANT CURRENT SOURCE
M5 ······ P-TYPE MOS TRANSISTOR

FIG. 7

60 ······ CURRENT SOURCE CELL
61,62,63,64,65,66 ······ N-TYPE MOS TRANSISTOR
67 ······ SECOND CONSTANT CURRENT SOURCE

FIG. 8

70 ······ D / A CONVERTER

FIG. 9

CURRENT SOURCE CELL AND D/A CONVERTER USING THE SAME

CROSS REFERENCE TO RELATED APPLICATION

This application is based upon and claims the benefit of priority from the prior Japanese Patent Application No. 2004-359704, filed on Dec. 13, 2004; the entire contents of which are incorporated herein by reference.

BACKGROUND OF THE INVENTION

1. Field of the Invention

The present invention relates to a current source cell which output predetermined current in accordance with a digital input signal and to a D/A converter using the same current source cell, and more particularly, to a sufficiently precise current source cell and a D/A converter using the same current source cell.

2. Related Background Art

A D/A converter (digital/analogue converter) is used for inputting calculated and processed digital data to an apparatus which is operated by an analogue signal.

In a conventional D/A converter to which a current source cell having an analogue switch connected to a current mirror circuit is connected in parallel, parasitic capacity exists in a transistor constituting the D/A converter. Thus, there is a problem that switching noise is generated in output waveform when the analogue switch is switched.

Further, with the requirement of low voltage and high precision of recent years, since the conventional current source cell does not have sufficient output resistance, there is a problem that the linearity is degraded and output waveform is distorted.

There is a known D/A converter in which a normally conducting transistor is serially connected to an analogue switch, thereby suppressing the generation of switching noise and to prevent output waveform from being distorted by switching noise. For example, see Japanese Patent Publication No.2573427, especially page 5 and FIG. 6 thereof.

The D/A converter disclosed in Japanese Patent Publication No.2573427 includes a decoder for decoding a digital input signal to output a control signal, a plurality of current source cells for outputting predetermined current in accordance with a control signal which is output from the decoder, and a resistor for converting a sum of output current of the current source cells into voltage.

The current source cell includes first and second transistors which are complementarily switched by a control signal output from the decoder, a constant current source which is commonly connected to one ends of current paths of the first and second transistors, and third and fourth transistors which are respectively connected to the other ends of the current paths of the first and second transistors and first and second output terminals, and which are in a normally conducting state.

Reference voltage which is sufficiently greater than threshold voltage is supplied to gates of the third and fourth transistors, and when voltage Vds between drain and source of the third and fourth transistors is sufficiently high, the third and fourth transistors are conducting in a saturation region.

When the third and fourth transistors are n-type MOS transistors, power source voltage Vdd is usually supplied to the gate, and when the third and fourth transistors are p-type MOS transistors, earth potential Vss is supplied to the gate.

The normally conducting third and fourth transistors are serially connected to the switching first and second transistors. Therefore, damping effect is generated by conduction resistance of the third and fourth transistors with respect to parasitic capacity of the transistors, and switching noise caused by switching of the first and second transistors is suppressed.

Further, the third and fourth transistors are serially connected to the constant current source through the first and second transistors. Thus, if the third and fourth transistors are conducting in the saturation region, the output resistance of the current source cell is greater than that of the constant current source only, and even if the output voltage of the D/A converter is varied, the D/A converter has excellent linearity.

In the case of the D/A converter disclosed in Japanese Patent Publication No.2573427, however, if the power source voltage is reduced by reduction of semiconductor device in size and the operation amplitude of output voltage of the D/A converter is relatively increased, the voltage Vds between drain and source of the third and fourth transistors becomes insufficient, the third and fourth transistors conduct in the linear region not in the saturation region and thus, there is a problem that the output resistance of the current source cell is largely reduced, the linearity of the D/A converter is degraded and the output waveform is distorted.

In order to suppress the generation of the switching noise caused by switching of the first and second transistors, to secure excellent linearity and to prevent output waveform from being distorted also in a region where the output voltage amplitude of the D/A converter is increased, it is necessary that the third and fourth transistors always conduct in the saturation region and the current source cell has extremely high output resistance.

When the first, second, third and fourth transistors are p-type MOS transistors and earth potential Vss is supplied to the gates of the third and fourth transistors, however, in order to operate the third and fourth transistors in the saturation region, it is necessary to set the output voltage amplitude with respect to earth potential Vss smaller than the absolute value of the threshold voltage of the third and fourth transistors based on a following inequality representing the operation of transistor in the saturation region:

$$Vds > Vgs - Vth$$

where Vds represents Voltage between drain and source, Vgs represents Voltage between gate and source, and Vth represents threshold voltage.

At present, the threshold voltage of usually used transistor is about 0.5V, and is about 0.7V even if substrate bias effect generated from a difference between source potential and bulk potential of the third and fourth transistors is taken into consideration.

This is not suitable for a D/A converter in which large amplitude operation of output amplitude of about 1.0V is required.

If the gate length is increased to increase the output resistance of the third and fourth transistors, since the parasitic capacity in the output terminal of the D/A converter is increased, there is a problem that frequency characteristics of the D/A converter are degraded.

Thus, a sufficiently precise current source cell also at the time of large amplitude operation and a D/A converter using such a current source cell are desired.

SUMMARY OF THE INVENTION

A current source cell of one embodiment according to the present invention comprises: first and second transistors which are complementarily switched by a control signal; a constant current source which is commonly connected to one ends of current paths of the first and second transistors; third and fourth transistors which are respectively connected between the other ends of the current paths of the first and second transistors and first and second output terminals, and which being in normally conducting states; and an inversion amplifier having an input terminal which is commonly connected to the one ends of the current paths of the first and second transistors, and having output terminal which is commonly connected to control terminals of the third and fourth transistors.

A D/A converter of one embodiment according to the present invention comprises: a decoder for decoding a digital input signal to output a control signal; a plurality of current source cells for outputting predetermined current in response to the control signal; and a resistor for converting a sum of output current of the plurality of current source cells into voltage; each of the current source cells comprises: first and second transistors which are complementarily switched by a control signal; a constant current source which is commonly connected to one ends of current paths of the first and second transistors; third and fourth transistors which are respectively connected between the other ends of the current paths of the first and second transistors and first and second output terminals, and which being in normally conducting states; and an inversion amplifier having an input terminal which is commonly connected to one ends of the current paths of the first and second transistors, and having output terminal which is commonly connected to control terminals of the third and fourth transistors.

BRIEF DESCRIPTION OF THE DRAWINGS

FIG. 5C is a diagram on which FIGS. 5A and 5B are superposed;

DETAILED DESCRIPTION OF THE EMBODIMENTS

Embodiments of the present invention will be explained with reference to the drawings.

First Embodiment

Figure 1:
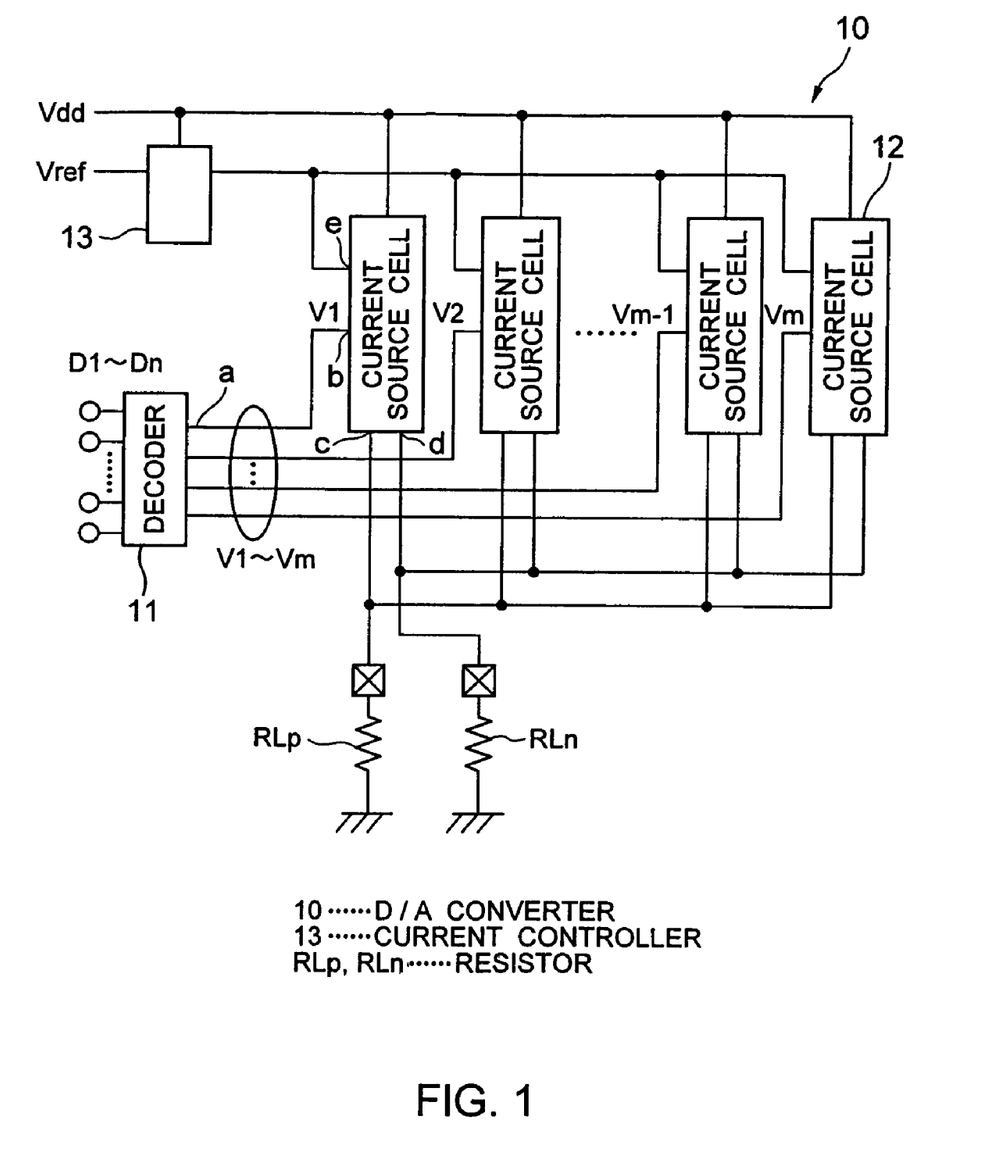
FIG. 1 is a block diagram showing a structure of a D/A converter according to a first embodiment of the present invention.
Figure 2:
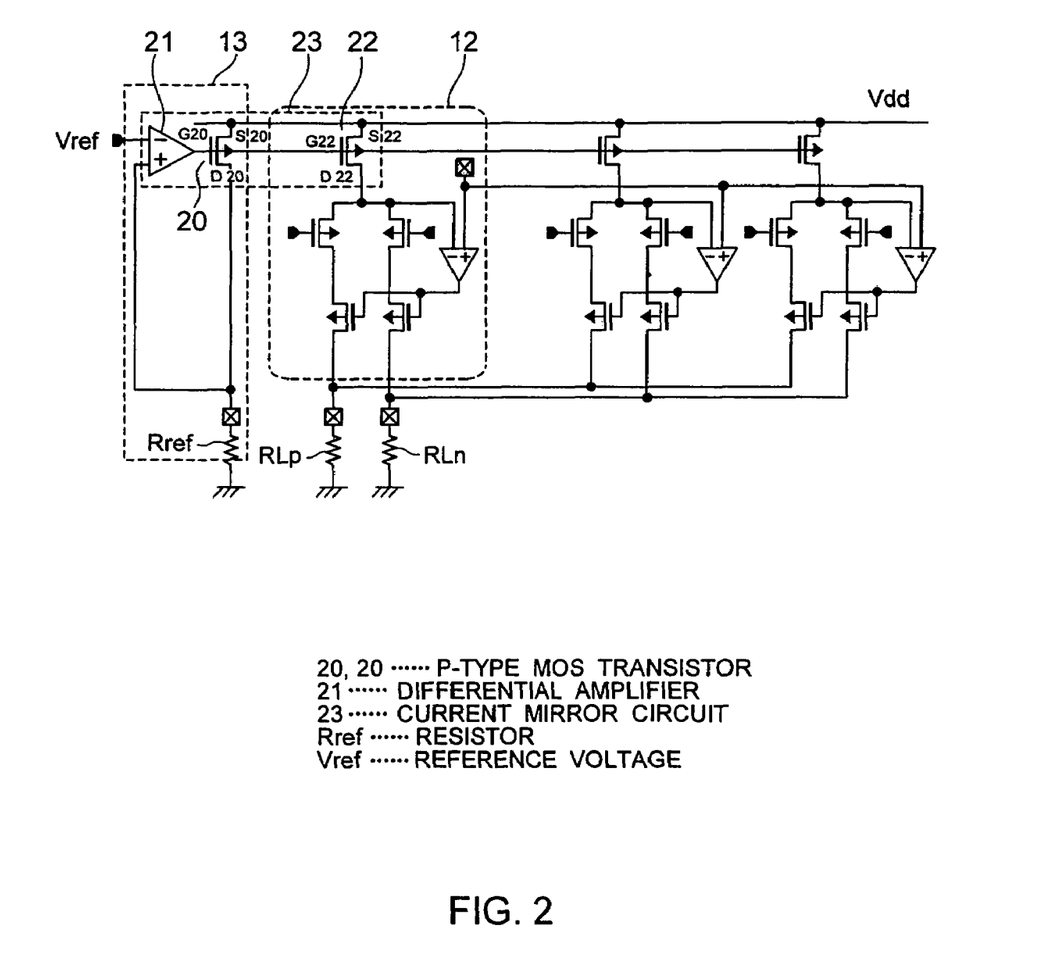
FIG. 2 is a circuit diagram showing a circuit structure of each block of the D/A converter according to the first embodiment of the present invention.
Figure 3:
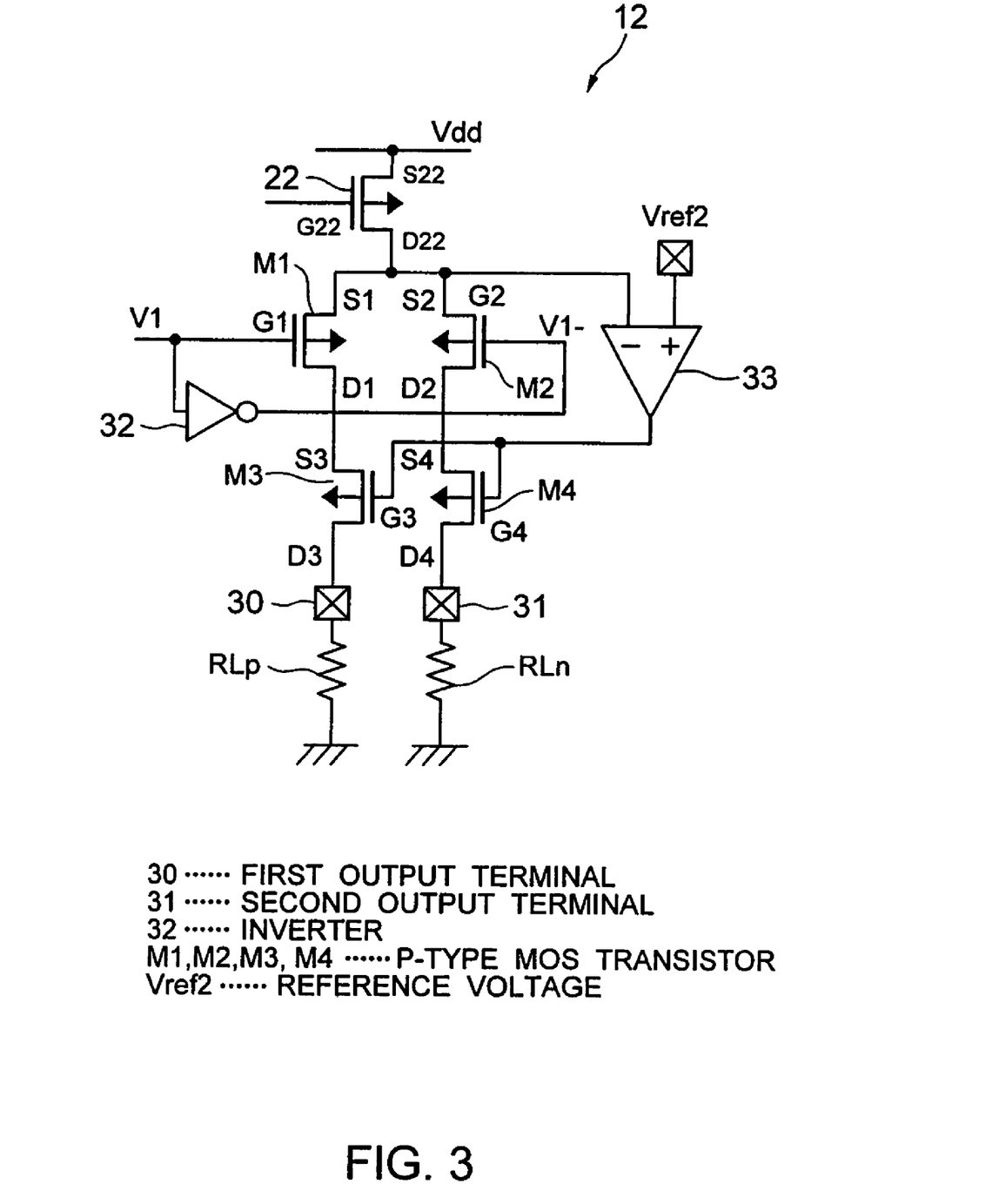
FIG. 3 is a circuit diagram showing a structure of a current source cell according to the first embodiment of the present invention.

FIG. 1 is a block diagram showing a structure of a D/A converter according to a first embodiment of the present invention. FIG. 2 is a circuit diagram showing a circuit structure of each block of the D/A converter according to the first embodiment of the present invention. FIG. 3 is a circuit diagram showing a structure of a current source cell.

As shown in FIG. 1, the D/A converter 10 includes a decoder 11 for decoding a digital signal to output a control signal, a plurality of current source cells 12 whose control signal input terminals b are connected to control signal output terminals a of the decoder 11, a resistor RLp to which a first output terminals c of the current source cells 12 are commonly connected, a resistor RLn to which second output terminals d are commonly connected, and a current controller 13 to which current control terminals e of the current source cells 12 are commonly connected.

The decoder 11 decodes n-bit digital signals D1 to Dn to generate m control signals, e.g. $2^n$ control signals V1 to Vm, and inputs each control signal to the control signal input terminal b of each of the current source cells 12.

Each current source cell 12 complementarily switches a built-in switch (not shown) in the current source cell 12 in accordance with a control signal to select one of the resistors RLp and RLn, and outputs predetermined current to the selected one of the resistors RLp and RLn.

The resistors RLp and RLn convert a sum of output currents of the selected current source cell 12 into voltage and outputs an analogue signal to an external apparatus (not shown), respectively.

Since current is complimentarily supplied to the resistors RLp and RLn, the sum of current flowing through the resistor RLp and current flowing through the resistor RLn is always constant.

The current controller 13 supplies control voltage which is necessary for the current source cells 12 for outputting predetermined current.

As shown in FIG. 2, the current controller 13 includes a p-type MOS transistor 20 (also mentioned simply as a transistor hereinafter) and a differential amplifier 21. The p-type MOS transistor 20 has a source S20 connected to the power source Vdd and a drain D20 grounded through a resistor Rref. The differential amplifier 21 has one of input terminals connected to the reference voltage Vref and the other of input terminals connected to the drain D20 of the transistor 20, and an output terminal connected to a gate G20 of the transistor 20.

The differential amplifier 21 is operated such that potential of the other input terminal becomes equal to potential Vref of the one input terminal and thus, current Iref flows through the serially connected transistor 20 and the resistor Rref such that the potential of the drain D20 of the transistor 20 becomes equal to the reference voltage Vref.

Since the gate G20 of the transistor 20 is connected to a gate G22 of a p-type transistor 22 whose source S22 is connected to the power source Vdd, the transistor 20 and the transistor 22 constitute a current mirror circuit 23.

With this, the transistor 22 functions as a constant current source through which constant current obtained by multiplying current Iref flowing through the transistor 20 by mirror ratio flows of the mirror circuit 23.

As shown in FIG. 3, the current source cell 12 includes the transistor 22 constituting the constant current source, p-type first and second transistors M1 and M2 having sources S1 and S2 commonly connected to the drain D22 of the transistor 22, a p-type third transistor M3 having source S3 connected to the drain D1 and a drain D3 connected to a first output terminal 30, and a p-type fourth transistor M4 having a source S4 connected to the drain D2 and a drain D4 connected to a second output terminal 31.

Further, the current source cell 12 includes an inverter 32 having an input terminal connected to a gate G1 of the first transistor M1 and having an output terminal connected to a gate G2 of a second transistor M2. The current source cell 12 also includes a differential amplifier 33. The differential amplifier 33 has one of input terminals commonly connected to the sources S1 and S2 of the first and second transistors M1 and M2, and the other of input terminals connected to a predetermined reference voltage Vref2, and an output terminal commonly connected to gates G3 and G4 of the third and fourth transistors M3 and M4.

If a control signal V1 is input to the gate G1 of the first transistor M1 from the decoder 11, a control signal V1—which is an inverted signal of the control signal V1 is input to the gate G2 of the second transistor M2. Thus, the first and second transistors M1 and M2 are complementarily switched in accordance with the control signal V1.

That is, when the first transistor M1 is turned ON by the control signal V1, the second transistor M2 is turned OFF and thus, current flowing through the transistor 22 is supplied to the resistor RLp connected to the first output terminal 30.

On the other hand, when the first transistor M1 is turned OFF by the control signal V1, the second transistor M2 is turned ON and thus, the current flowing through the transistor 22 is supplied to the resistor RLn connected to the second output terminal 31.

The first and second transistors M1 and M2 are operated in the linear region to secure the switching speed. Output voltage of the differential amplifier 33 is applied to the gates G3 and G4 of the third and fourth transistors M3 and M4 so that the third and fourth transistors M3 and M4 always conduct in the saturation region also at the time of large amplitude operation.

Next, the operation of a following circuit will be explained. The circuit includes the transistor 22 constituting the constant current source, the first switching transistor M1, the third transistor M3 having a damping resistor function and an output resistance enhancing function, and the differential amplifier 33. The transistor 22 is serially connected to the third transistor M3 through the first switching transistor M1. The differential amplifier 33 is connected to the transistor 22 and to the third transistor M3. Thereby, the circuit is formed.

Figure 4A:
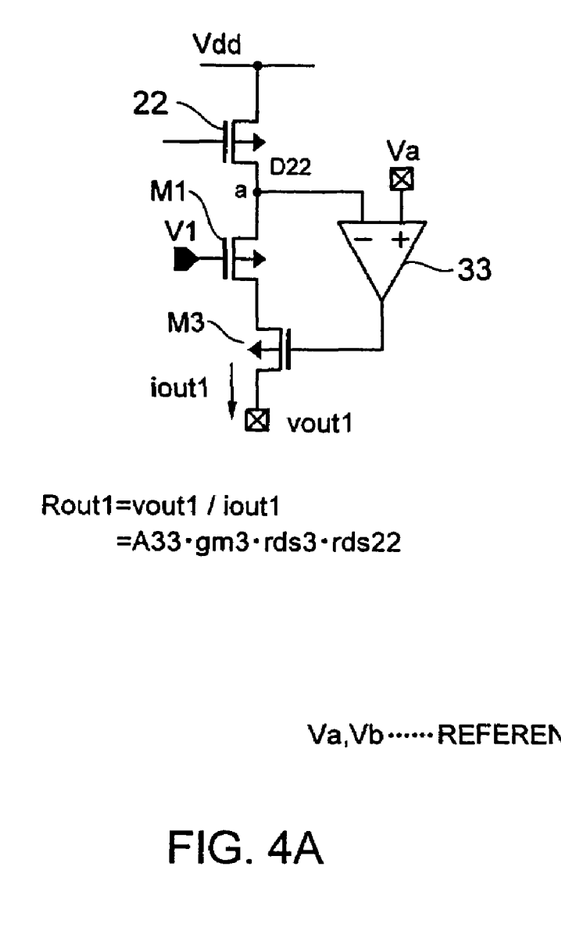
FIG. 4A is a circuit diagram of a circuit of the first embodiment used for explaining a principle of the present invention.
Figure 4B:
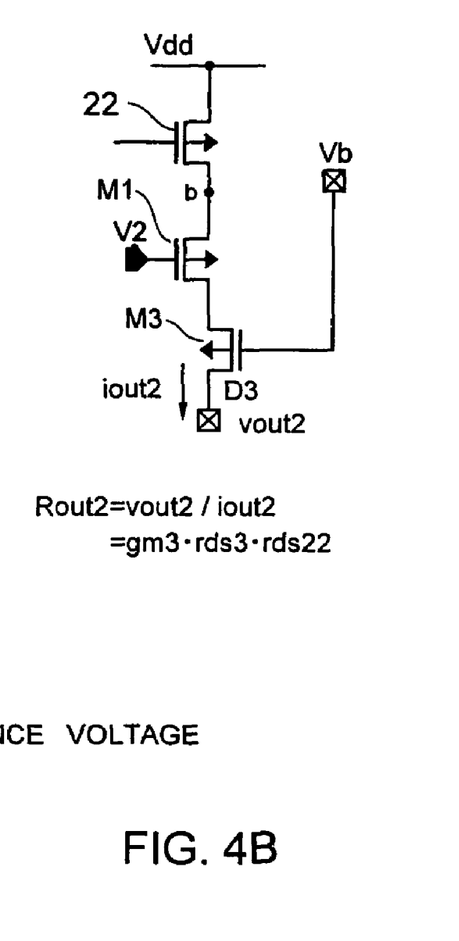
FIG. 4B is a circuit diagram of a conventional circuit for comparison.

In FIGS. 4A and 4B, attention is paid to a current path after the current source cell is complementarily switched for comparison with output resistances of the current source cells. FIG. 4A shows a circuit of this embodiment according to the present invention, and FIG. 4B shows a conventional circuit.

As shown in FIG. 4A, in the circuit of this embodiment, the differential amplifier 33 is operated such that potential of the other input terminal of the differential amplifier 33 becomes equal to potential Va of the one input terminal of the differential amplifier 33 and thus, potential of a node a is fixed to Va, and voltage variation at the drain D22 of the transistor 22 does not affect the potential almost at all.

On the other hand, in the conventional circuit shown in FIG. 4B, voltage variation at the drain D3 of the transistor M3 considerably affects potential of a node b.

As the voltage variation at the node a becomes smaller, current flowing through the third transistor M3, i.e., output current is less prone to be varied as compared with the conventional circuit. This means that the output resistance of the circuit of the embodiment according to the present invention is higher than that of the conventional circuit.

The output resistance Rout1 of the circuit of the embodiment shown in FIG. 4A and an output resistance Rout 2 of the conventional circuit shown in FIG. 4B are expressed as the following equations:

$$Rout1 = A33 \cdot gm3 \cdot rds3 \cdot rds22 \quad (1)$$

$$Rout2 = gm3 \cdot rds3 \cdot rds22 \quad (2)$$

wherein, A33 represents a gain of the differential amplifier 33, gm3 represents transmitting conductance of the third transistor M3, and rds3 and rds22 respectively represent output resistance of the first transistor M1 and that of the transistor 22.

Since the first switching transistor M1 is ON in the linear region, the conductive resistor is extremely small and can be ignored.

With this, it can be found that the output resistance of the circuit of the embodiment becomes higher than that of the conventional circuit according as the gain of the differential amplifier 33.

Therefore, the circuit of the embodiment has more excellent linearity also during the large amplitude operation, and current having small distortion in the output signal can be output.

Figure 5A:
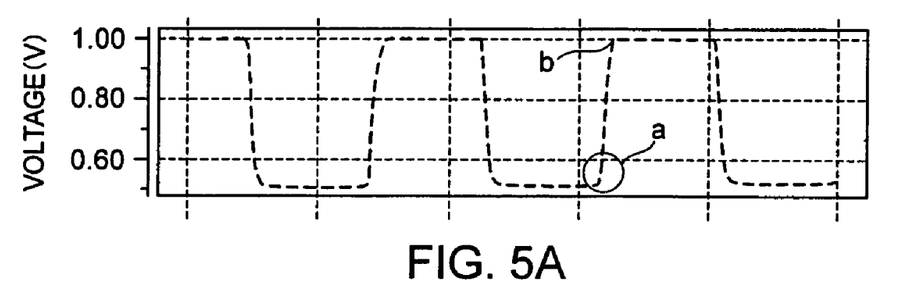
FIG. 5A is a diagram showing output characteristics of the D/A converter according to the first embodiment of the present invention.
Figure 5B:
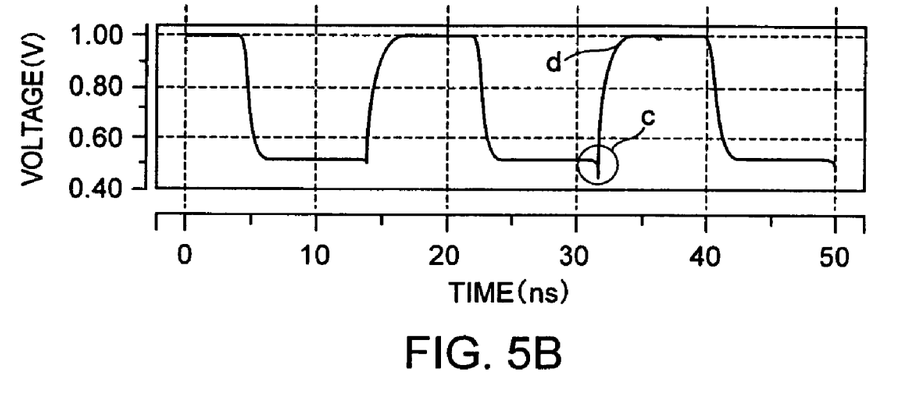
FIG. 5B is a diagram showing output characteristics of a conventional D/A converter for comparison.

FIGS. 5A and 5B show output characteristics of the D/A converter 10 for comparison with the conventional art. FIG. 5A shows output characteristic of the D/A converter 10 of the embodiment according to the present invention and FIG. 5B shows that of the conventional D/A converter.

Figure 5C:
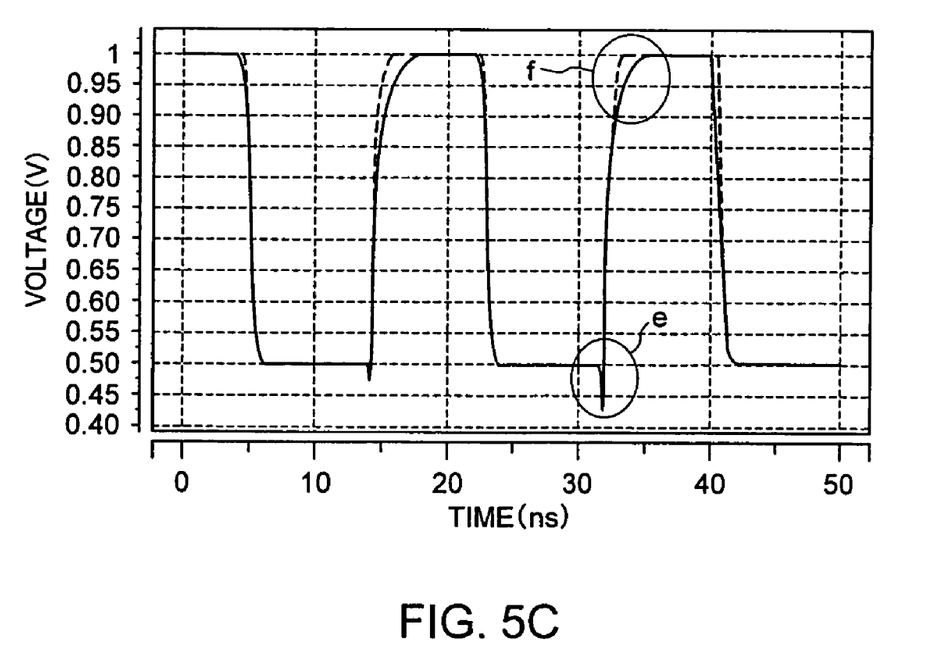

FIGS. 5A and 5B are superposed on FIG. 5C to clearly show the difference between FIGS. 5A and 5B.

FIGS. 5A, 5B and 5C show a result of simulation in a case that the D/A converter 10 alternately outputs 0.5V and 1.0V repeatedly at cycle of about 18 ns when the power source voltage Vdd is 2.5V.

As shown in FIG. 5A, in the D/A converter 10 of the embodiment, spike noise can not be found at a point a at which the output voltage is switched from 0.5V to 1V, and the switching noise is suppressed. Further, an output signal is swiftly settling also at a point b in the vicinity of 1V.

On the other hand, in the conventional D/A converter shown in FIG. 5B, negative spike is found at a point c at which the output voltage is switched from 0.5V to 1V, and switching noise is generated.

It can be found that the output signal is distorted because settling time of the output signal at a point d in the vicinity of 0.8V to 1.0V is abruptly increased.

Therefore, as shown in FIG. 5C, it can be found that the switching noise is suppressed at a point e at which the output voltage is switched from 0.5V to 1V, and distortion of output waveform at point f in the vicinity of 0.8V to 1.0V is improved.

Figure 6:
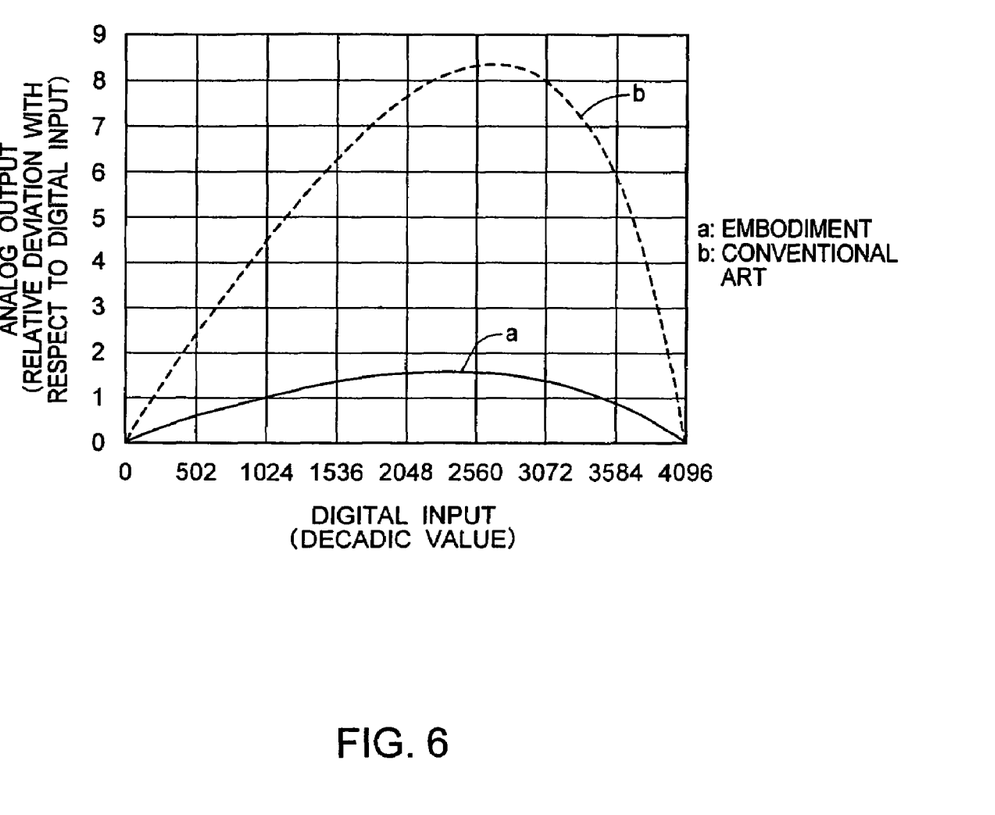
FIG. 6 is a diagram showing output characteristics of the D/A converter according to the first embodiment of the present invention.

FIG. 6 shows linearity of output of a D/A converter 10 under a condition of output amplitude of 1.0V for comparison with the conventional art. In FIG. 6, a solid line a shows the embodiment according to the present invention and a broken line b shows the conventional example.

The lateral axis in FIG. 6 shows digital input in which 12 bit digital value is expressed decimally, and the vertical axis shows integration nonlinearity of the D/A converter.

The integration nonlinearity represents an error obtained by subtracting output of an actual D/A converter from an ideal D/A conversion straight line with relative deviation, and the integration nonlinearity is one of indices showing linearity of the D/A converter. In this embodiment according to the invention, the integration nonlinearity is improved to 1/5 in maximum as compared with the conventional example.

As explained above, in the D/A converter 10 using the current source cell 12 of the first embodiment according to the present invention, since the third and fourth transistors M3 and M4 are always operated in the saturation region also at the time of large amplitude operation, the output resistance of the current source cell can be increased in accordance with the gain of the differential amplifier 33.

As a result, it is possible to prevent the switching noise from being generated also at the time of large amplitude operation, and to obtain a current source cell having small distortion of the output signal of excellent linearity. Thus, it is possible to provide a sufficiently precise D/A converter.

Second Embodiment

Figure 7:
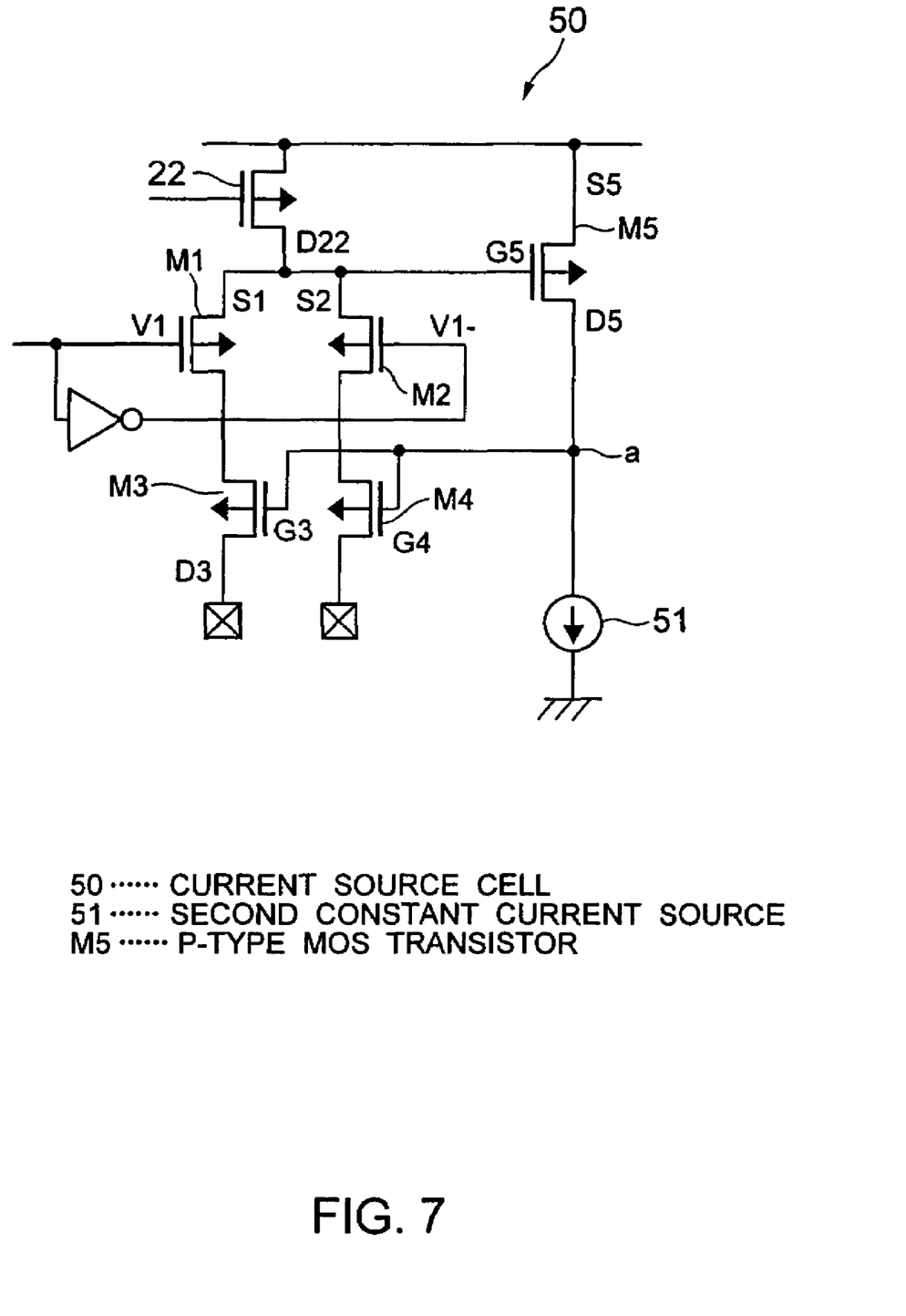
FIG. 7 is a circuit diagram showing a structure of a current source cell according to a second embodiment of the present invention.

FIG. 7 shows a current source cell of a D/A converter of a second embodiment according to the present invention. In the second embodiment, the same constituent elements as those in the first embodiment are designated with the same reference numerals, explanation thereof will be omitted, and only the different portions will be explained.

The second embodiment is different from the first embodiment in that the differential inversion amplifier means is inversion amplifier means of a series circuit of a transistor and a constant current source.

That is, as shown in FIG. 7, a current source cell 50 of the second embodiment includes a serially connected p-type fifth transistor M5 and a second constant current source 51. A gate G5 of the fifth transistor M5 is commonly connected to sources S1 and S2 of the first and second transistors M1 and M2. A drain D5 of the fifth transistor M5 and a node a of the second constant current source 51 are commonly connected to gates G3 and G4 of the third and fourth transistors M3 and M4.

Further, a source S5 of the fifth transistor M5 is connected to the power source Vdd, and an end of the fifth transistor M5 opposite from the node a of the second constant current source 51 is grounded.

Since constant current flows through the fifth transistor M5 by the second constant current source 51, potential of the gate G5 is maintained at a constant level.

That is, in the current mirror circuit 23, the voltage variation at the end of the drain D3 of the third transistor M3 does not affect an end of the drain D22 of the transistor 22 constituting the constant current source almost at all.

Gate potential G5 can be set to a desired value by the current of the second constant current source 51 and element size of the fifth transistor M5.

That is, since voltage between drain and source of each of the third and fourth transistors M3 and M4 is secured at certain level also at the time of large amplitude operation, the third and fourth transistors M3 and M4 can be operated always in the saturation region.

As a result, the third and fourth transistors M3 and M4 are operated always in the saturation region also at the time of large amplitude operation, and it is possible to obtain extremely high output resistance according as a gain of the inversion amplifier means constituted by the second constant current source 51 and the fifth transistor M5.

In the current source cell 50 of the second embodiment according to the present invention, the differential inversion amplifier means comprises the inversion amplifier means including the series circuit of the fifth transistor M5 and the second constant current source 51. Thus, there is an advantage that reference voltage Vref2 is unnecessary, and the circuit is simplified.

Although the current source cell 50 comprises p-type MOS transistors, n-type MOS transistors may be used.

Figure 8:
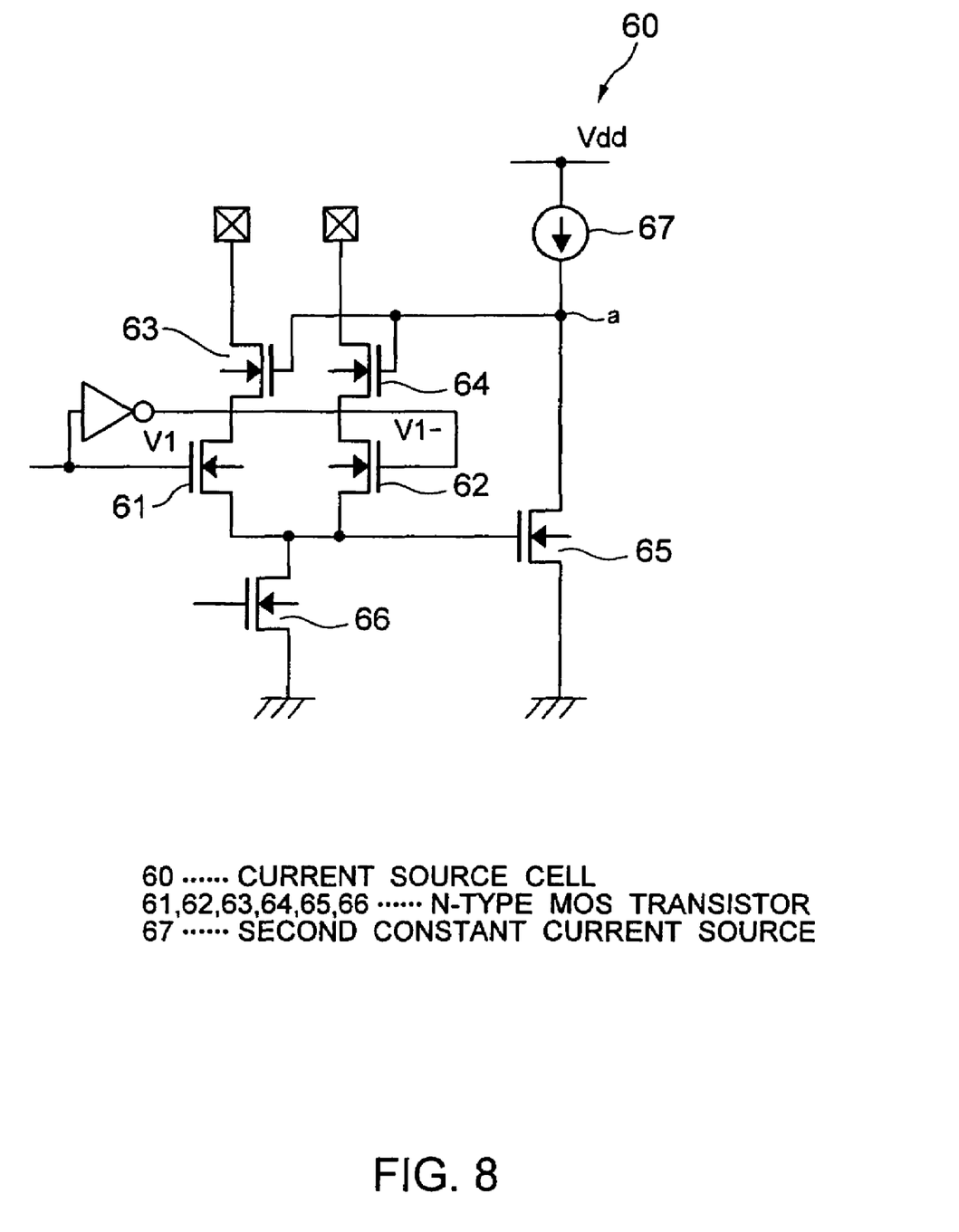
FIG. 8 is circuit diagram showing another structure of the current source cell according to the second embodiment of the present invention.
Figure 9:
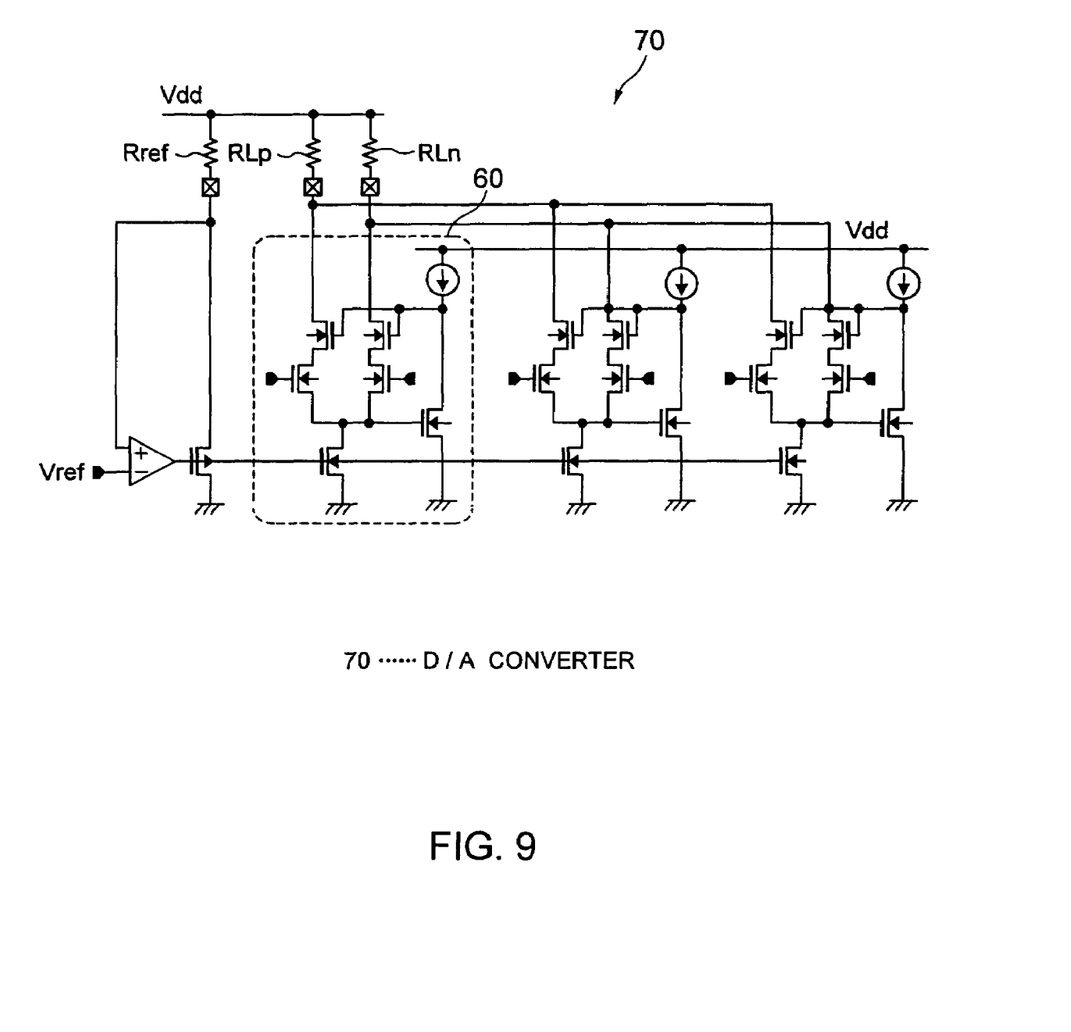
FIG. 9 is a circuit diagram showing a D/A converter using another current source cell according to the second embodiment of the present invention.

FIG. 8 is a circuit diagram of a current source cell 60 when n-type MOS transistors are used. FIG. 9 is a circuit diagram showing a D/A converter 70 using current source cells 60.

As explained above, according to each of the embodiments of the present invention, the third and fourth transistors can be operated always in the saturation region also at the time of large amplitude operation, and it is possible to obtain current source cell having extremely high output resistance by negative feedback function of the third and fourth transistors and the inversion amplifier means.

As a result, switching noise can be prevented from being generated, and it is possible to obtain a current source cell having excellent linearity and small distortion of output signal also at the time of large amplitude operation. Thus, it is possible to provide a precise D/A converter securing large amplitude operation.

What is claimed is:

1. A current source cell comprising:
   first and second transistors which are complementarily switched by a control signal; a constant current source which is commonly connected to one ends of current paths of the first and second transistors;
   third and fourth transistors which are respectively connected between the other ends of the current paths of the first and second transistors and first and second output terminals, and which being in normally conducting states; and
   an inversion amplifier having an input terminal which is commonly connected to the one ends of the current paths of the first and second transistors, and having output terminal which is commonly connected to control terminals of the third and fourth transistors:
   wherein the inversion amplifier comprises a fifth transistor and a second constant current source serially connected with each other, a control terminal of the fifth transistor being commonly connected to one ends of the current paths of the first and second transistors, and a connection node between the fifth transistor and the second constant current source being commonly connected to control terminals of the third and fourth transistors.

2. The current source cell according to claim 1, wherein the first to fifth transistors are p-type MOS transistors.

3. The current source cell according to claim 1, wherein the first to fifth transistors are n-type MOS transistors.

4. A D/A converter comprising:
   a decoder for decoding a digital input signal to output a control signal;
   a plurality of current source cells for outputting predetermined current in response to the control signal; and a resistor for converting a sum of output current of the plurality of current source cells into voltage;

each of the current source cells comprises:

first and second transistors which are complementarily switched by a control signal;

a constant current source which is commonly connected to one ends of current paths of the first and second transistors;

third and fourth transistors which are respectively connected between the other ends of the current paths of the first and second transistors and first and second output terminals, and which being in normally conducting states; and an inversion amplifier having an input terminal which is commonly connected to one ends of the current paths of the first and second transistors, and having output terminal which is commonly connected to control terminals of the third and fourth transistors.

5. The D/A converter according to claim 4, wherein the inversion amplifier is a differential invasion amplifier having a second input terminal connected to predetermined reference potential.

6. The D/A converter according to claim 4, wherein the control signal is input to one of control terminals of the first and second transistors, and the control signal being input to the other one of the control terminals of the first and second transistors through a signal inverter.

7. The D/A converter according to claim 4, wherein the first to fourth transistors are p-type MOS transistors.

8. The D/A convener according to claim 4, wherein the first to fourth transistors are n-type MOS transistors.

9. The D/A convener according to claim 4, wherein the inversion amplifier comprises a fifth transistor and a second constant current source serially connected wit each other, a control terminal of the fifth transistor being commonly connected to one ends of the current paths of the first and second transistors, and a connection node between the fifth transistor and the second constant current source being commonly connected to control terminals of the third and fourth transistors.

10. The D/A converter according to claim 9, wherein the first to fifth transistors are p-type MOS transistors.

11. The D/A converter according to claim 9, wherein the first to fifth transistors are n-type MOS transistors.

* * * * *